(12) United States Patent
Tokuda

(10) Patent No.: US 11,765,951 B2
(45) Date of Patent: Sep. 19, 2023

(54) TFT ARRAY SUBSTRATE INCLUDING A HEAT DISSIPATION LAYER IN A CURVED REGION

(71) Applicant: Japan Display Inc., Tokyo (JP)

(72) Inventor: Naoki Tokuda, Minato-ku (JP)

(73) Assignee: Japan Display Inc., Tokyo (JP)

( * ) Notice: Subject to any disclaimer, the term of this patent is extended or adjusted under 35 U.S.C. 154(b) by 37 days.

(21) Appl. No.: 17/496,158

(22) Filed: Oct. 7, 2021

(65) Prior Publication Data

US 2022/0028959 A1 Jan. 27, 2022

Related U.S. Application Data

(63) Continuation of application No. 16/575,629, filed on Sep. 19, 2019, now Pat. No. 11,222,940, which is a continuation of application No. PCT/JP2017/047275, filed on Dec. 28, 2017.

(30) Foreign Application Priority Data

Mar. 24, 2017 (JP) .................................. 2017-058438

(51) Int. Cl.
*G02F 1/13* (2006.01)
*G06F 1/16* (2006.01)
(Continued)

(52) U.S. Cl.
CPC ......... *H10K 59/131* (2023.02); *G09G 3/3225* (2013.01); *H10K 50/87* (2023.02);
(Continued)

(58) Field of Classification Search
CPC ............ H01L 27/3276; H01L 27/3297; H01L 27/3265; H01L 51/0097; H01L 51/529;
(Continued)

(56) References Cited

U.S. PATENT DOCUMENTS 8,610,349 B2 12/2013 Kim
9,733,423 B2 8/2017 Chae
(Continued)

FOREIGN PATENT DOCUMENTS

CN 103229225 A 7/2013
JP 06-28840 U 4/1994
(Continued)

OTHER PUBLICATIONS

International Search Report dated Apr. 3, 2018 in PCT/JP2017/047275 filed Dec. 28, 2017 (with English Translation).
(Continued)

*Primary Examiner* — Ida M Soward
(74) *Attorney, Agent, or Firm* — Maier & Maier, PLLC

(57) ABSTRACT

A display device according to an embodiment of the present invention includes: a base material including a display region and a curved region; a wiring line disposed on the base material and disposed from the display region over the curved region; and a heat dissipating layer formed corresponding to a position at which the wiring line is disposed in the curved region.

19 Claims, 8 Drawing Sheets

(51) Int. Cl.
  G09F 9/30 (2006.01)
  G09G 3/32 (2016.01)
  H10K 59/131 (2023.01)
  G09G 3/3225 (2016.01)
  H10K 50/87 (2023.01)
  H10K 77/10 (2023.01)
  H10K 10/46 (2023.01)
  H10K 50/844 (2023.01)
  H10K 59/121 (2023.01)
  H10K 102/00 (2023.01)
  G02F 1/1333 (2006.01)

(52) U.S. Cl.
  CPC ...... H10K 77/111 (2023.02); *G02F 1/133305* (2013.01); *G06F 1/1641* (2013.01); *G06F 1/1652* (2013.01); *G09F 9/301* (2013.01); *G09G 2300/0408* (2013.01); *G09G 2300/0804* (2013.01); *H10K 10/464* (2023.02); *H10K 50/844* (2023.02); *H10K 59/1216* (2023.02); *H10K 2102/00* (2023.02); *H10K 2102/311* (2023.02); *H10K 2102/351* (2023.02); *Y02E 10/549* (2013.01)

(58) Field of Classification Search
  CPC ............. H01L 51/5253; H01L 51/0541; H01L 2251/5338; H01L 2251/301; H01L 2251/558; G09G 2300/0408; G09G 2300/0804; G06F 1/1641; G06F 1/1652; G06F 9/301; G02F 1/133305
  See application file for complete search history.

(56) References Cited

U.S. PATENT DOCUMENTS

| | | | |
|---|---|---|---|
| 9,756,733 B2 | 9/2017 | Drzaic | |
| 9,793,512 B2 | 10/2017 | Choi | |
| 9,941,335 B2 | 4/2018 | Park | |
| 10,050,227 B2 | 8/2018 | Park | |
| 10,236,471 B2 | 3/2019 | Oh | |
| 10,483,491 B2* | 11/2019 | Choi | G02F 1/133305 |
| 2014/0055328 A1 | 2/2014 | Osako | |
| 2015/0220181 A1 | 8/2015 | Jung | |
| 2016/0073528 A1* | 3/2016 | Park | H10K 50/87 |
| | | | 361/752 |
| 2016/0104856 A1 | 4/2016 | Naijo | |
| 2016/0209580 A1* | 7/2016 | Hosoki | G02B 6/0085 |
| 2016/0274297 A1* | 9/2016 | Ikuta | G02B 6/005 |
| 2016/0282549 A1* | 9/2016 | Masuda | G02F 1/133308 |
| 2017/0148702 A1 | 5/2017 | Funayama et al. | |
| 2017/0250237 A1* | 8/2017 | Cheng | G02F 1/136286 |
| 2017/0278900 A1* | 9/2017 | Yang | G06F 3/0446 |
| 2017/0294620 A1* | 10/2017 | Park | H10K 50/844 |
| 2019/0173052 A1* | 6/2019 | Oh | H10K 50/814 |

FOREIGN PATENT DOCUMENTS

| | | |
|---|---|---|
| JP | 2015-129891 A | 7/2015 |
| JP | 2016-031499 A | 3/2016 |
| JP | 2017-097163 A | 6/2017 |
| WO | WO 2013/051236 A1 | 4/2013 |
| WO | WO 2016/057231 A1 | 4/2016 |

OTHER PUBLICATIONS

International Preliminary Report on Patentability and Written Opinion dated Sep. 24, 2019 in PCT/JP2017/047275 (submitting English translation only), 9 pages.
Office Action dated Aug. 4, 2020 in corresponding Japanese Patent Application No. 2017-058438 (with English Translation), 7 pages.
Combined Chinese Office Action and Search Report dated Dec. 25, 2020 in corresponding Chinese Patent Application No. 201780088894.6 (with English Translation of Category of Cited Documents), 9 pages.

* cited by examiner

TFT ARRAY SUBSTRATE INCLUDING A HEAT DISSIPATION LAYER IN A CURVED REGION

CROSS-REFERENCE TO RELATED APPLICATIONS

This application is a continuation of U.S. application Ser. No. 16/575,629 filed Sep. 19, 2019, and which is a continuation under 35 U.S.C. 120 of International Application PCT/JP2017/047275 having the International Filing Date of Dec. 28, 2017, and having the benefit of the earlier filing date of Japanese Application No. 2017-058438, filed on Mar. 24, 2017. Each of the identified applications is fully incorporated herein by reference.

BACKGROUND OF THE INVENTION

1. Field of the Invention

One or more embodiments of the present invention relate to a display device.

2. Description of the Related Art

In a display device including a display region, such as an organic electroluminescent (EL) display device or a liquid crystal display device, the development of a flexible display in which a display panel can be curved has recently progressed with use of a base material having flexibility.

For example, as disclosed in JP 2016-31499 A, it is proposed to achieve a narrower picture-frame by curving a mounting section for an integrated circuit (IC) or a flexible printed circuit board (FPC) to the rear side of the display region.

SUMMARY OF THE INVENTION

For example, a wiring line is disposed on the base material in the display panel. However, the breakage of the display panel due to heat generation of the wiring line may occur in the vicinity of the curved region.

One or more embodiments of the invention have been made in view of the above, it is an object thereof to provide a display device in which an adverse effect due to heat generation of a wiring line in a curved region is suppressed.

A display device according to an embodiment of the invention includes: a base material including a display region and a curved region; a wiring line disposed on the base material and disposed from the display region over the curved region; and a heat dissipating layer formed corresponding to a position at which the wiring line is disposed in the curved region.

DETAILED DESCRIPTION OF THE INVENTION

Figure 1:
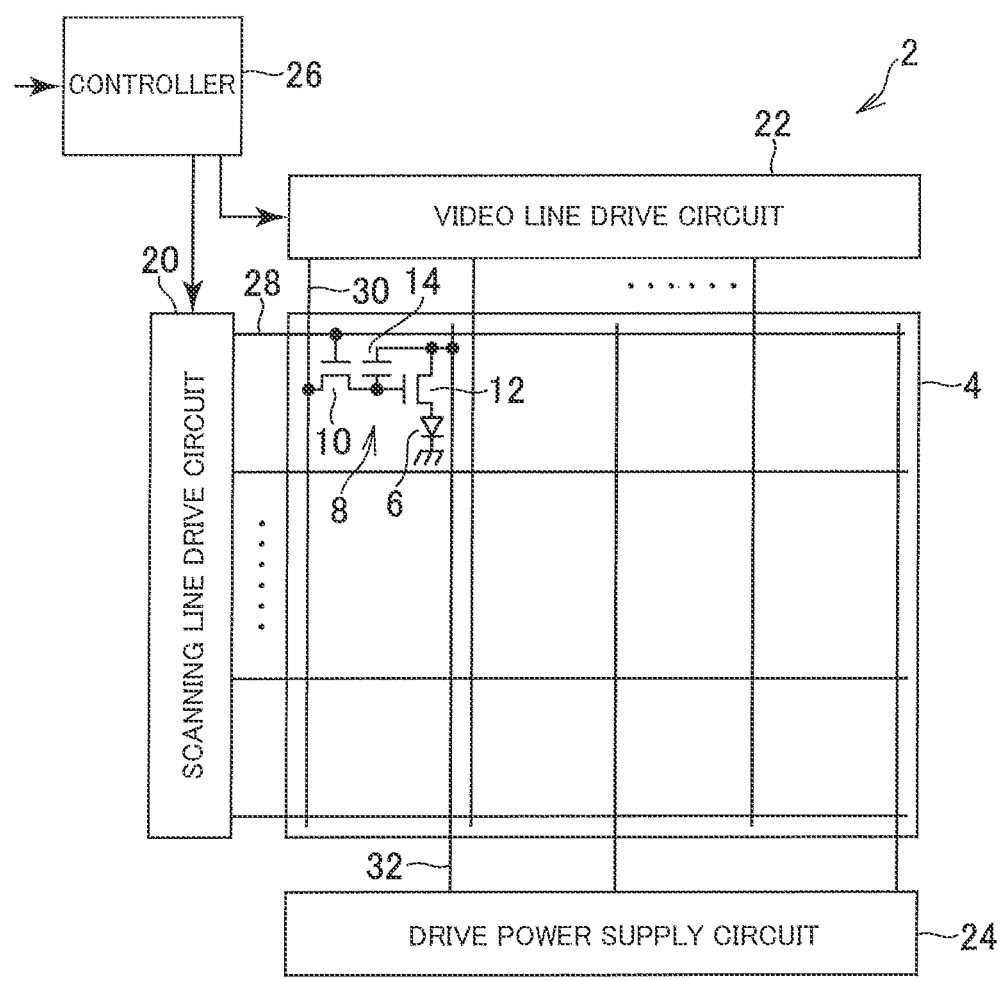
FIG. 1 is a schematic view showing a schematic configuration of an organic EL display device according to one embodiment of the invention.

Hereinafter, embodiments of the invention will be described with reference to the drawings. The disclosure is illustrative only. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in an actual form. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

FIG. 1 is a schematic view showing a schematic configuration of a display device according to one embodiment of the invention, showing an organic EL display device as an example. The organic EL display device 2 includes a pixel array section 4 that displays an image, and a drive section that drives the pixel array section 4. The organic EL display device 2 is a flexible display using a resin film as a base material (substrate), and a stacked structure of a thin film transistor (TFT), an organic light emitting diode (OLED), and the like is formed on the base material composed of the resin film. The schematic view shown in FIG. 1 is one example, and the embodiment is not limited to this example.

In the pixel array section 4, OLEDs 6 and pixel circuits 8 are disposed in a matrix corresponding to pixels. The pixel circuit 8 includes a plurality of TFTs 10 and 12 and a capacitor 14.

The drive section includes a scanning line drive circuit 20, a video line drive circuit 22, a drive power supply circuit 24, and a controller 26. The drive section drives the pixel circuit 8 and controls emission of the OLED 6.

The scanning line drive circuit 20 is connected to scanning signal lines 28 each provided for an array of pixels in the horizontal direction (a pixel row). The scanning line drive circuit 20 sequentially selects the scanning signal line 28 in response a timing signal input from the controller 26, and applies a voltage for turning on the lighting TFT 10 to the selected scanning signal line 28.

The video line drive circuit 22 is connected to video signal lines 30 each provided for an array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal in the selected pixel row to each of the video signal lines 30. The voltage is written to the capacitor 14 via the lighting TFT 10 in the selected pixel row. The drive TFT 12 supplies a current in response to the written voltage to the OLED 6, and thus the OLED 6 of the pixel corresponding to the selected scanning signal line 28 emits light.

The drive power supply circuit 24 is connected to drive power supply lines 32 each provided for the pixel column, and supplies a current to the OLED 6 via the drive power supply line 32 and the drive TFT 12 in the selected pixel row.

Here, a lower electrode of the OLED 6 is connected to the drive TFT 12. On the other hand, upper electrodes of the OLEDs 6 are composed of an electrode common to the OLEDs 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
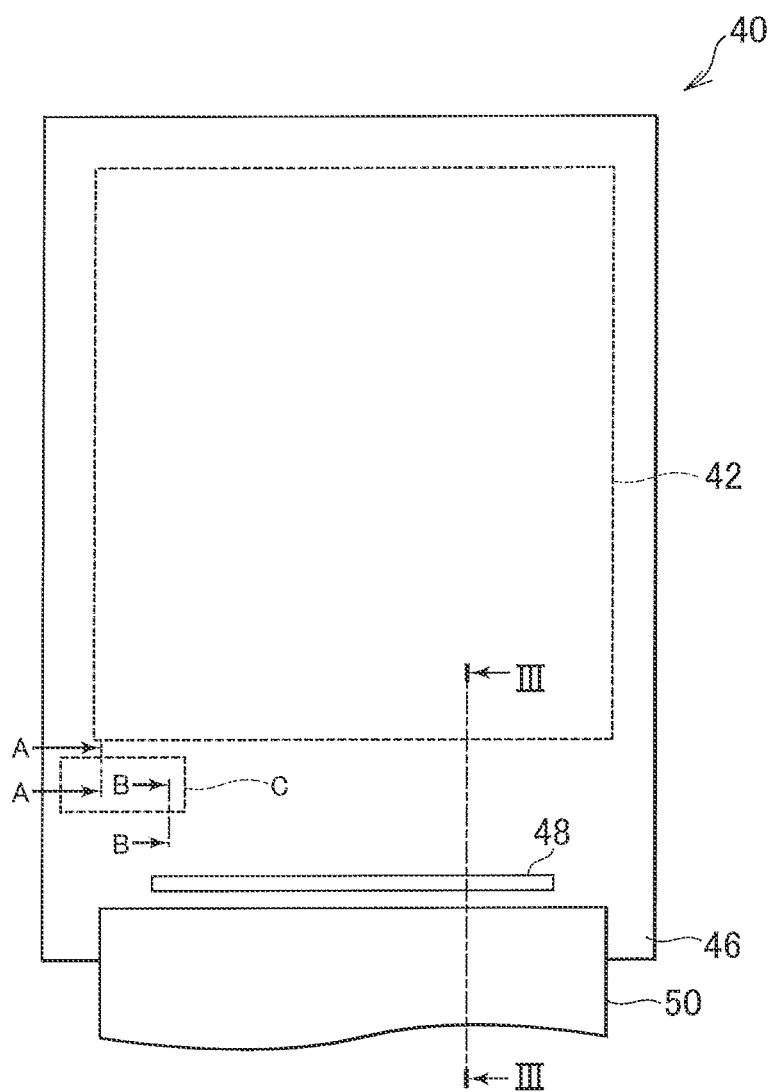
FIG. 2 is a schematic plan view showing one example of a display panel of the organic EL display device shown in FIG. 1.

FIG. 2 is a schematic plan view showing one example of a display panel of the organic EL display device shown in FIG. 1. The pixel array section 4 shown in FIG. 1 is provided in a display region 42 of a display panel 40, and the OLEDs 6 are arranged in the pixel array section 4 as described above. The upper electrode constituting the OLED 6 is formed common to the pixels as described above, and covers the entire display region 42.

A component mounting region 46 is provided at one side of the display panel 40 having a rectangular shape, and wiring lines connecting to the display region 42 are disposed in the component mounting region 46. A driver IC 48 constituting the drive section is mounted in the component mounting region 46, or an FPC 50 is connected thereto. The FPC 50 is connected to the controller 26, the circuits 20, 22, and 24, and the like, or an IC is mounted on the FPC 50.

Figure 3:
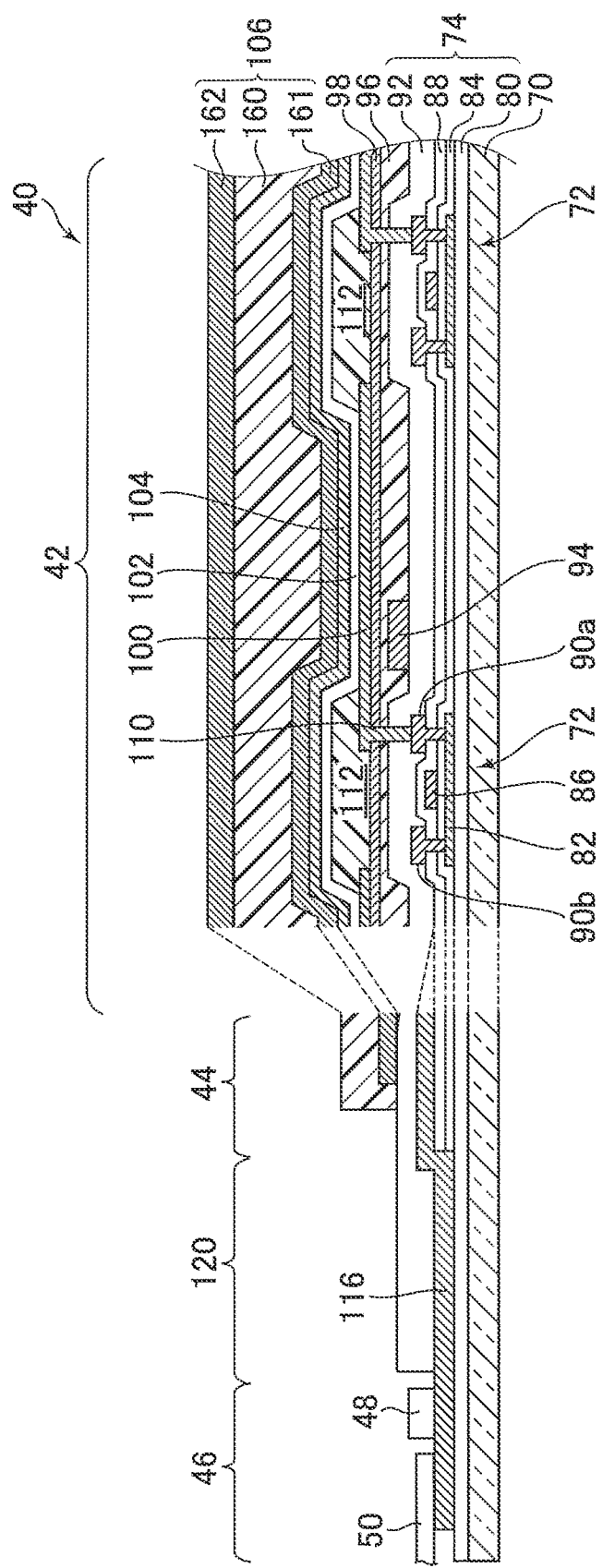
FIG. 3 is a diagram showing one example of a cross section along line III-III of FIG. 2.

FIG. 3 is a diagram showing one example of a cross section along line III-III of FIG. 2. The display panel 40 has a structure in which a circuit layer 74 including TFTs 72 formed therein, the OLEDs 6, a sealing layer 106 sealing the OLEDs 6, and the like are stacked on a base material 70 composed of a resin film. As the resin film constituting the base material 70, for example, a polyimide-based resin film is used. A protective layer (not shown) is formed on the sealing layer 106. In the embodiment, the pixel array section 4 is of a top-emission type, and the light generated by the OLEG 6 is emitted to the side (upward in FIG. 3) opposite to the base material 70 side. When a color filter system is employed as a coloring system in the organic EL display device 2, a color filter is disposed, for example, between the sealing layer 106 and the protective layer (not shown), or on a counter substrate side. By passing white light generated by the OLED 6 through the color filter, light of, for example, red (R), green (G), and blue (B) is produced.

The pixel circuit 8, the scanning signal line 28, the video signal line 30, the drive power supply line 32, and the like, which are described above, are formed in the circuit layer 74 of the display region 42. At least a portion of the drive section can be formed as the circuit layer 74 on the base material 70 in a region adjacent to the display region 42. As described above, the driver IC 48 constituting the drive section and the FPC 50 can be connected to a wiring line 116 of the circuit layer 74 in the component mounting region 46.

As shown in FIG. 3, an under layer 80 formed of an inorganic insulating material is disposed on the base material 70. As the inorganic insulating material, for example, silicon nitride ($SiN_y$), silicon oxide ($SiO_x$), and a complex of $SiN_y$ and $SiO_x$ are used.

In the display region 42, a semiconductor region 82 serving as a channel section and a source-drain section of the TFT 72 of a top-gate type is formed on the base material 70 via the under layer 80. The semiconductor region 82 is formed of, for example, polysilicon (p-Si). The semiconductor region 82 is formed by, for example, providing a semiconductor layer (p-Si film) on the base material 70 and patterning the semiconductor layer to selectively leave a place used in the circuit layer 74.

A gate electrode 86 is disposed on the channel section of the TFT 72 via a gate insulating film 84. The gate insulating film 84 is typically formed of TEOS. The gate electrode 86 is formed by, for example, patterning a metal film formed by sputtering or the like. An interlayer insulating layer 88 is disposed on the gate electrode 86 so as to cover the gate electrode 86. The interlayer insulating layer 88 is formed of, for example, the above-described inorganic insulating material. An impurity is introduced by ion implantation into the semiconductor region 82 (p-Si) serving as the source-drain section of the TFT 72. Further, a source electrode 90a and a drain electrode 90b that are electrically connected to the source-drain section are formed, so that the TFT 72 is configured.

An interlayer insulating film 92 is disposed on the TFT 72. A wiring line 94 is disposed on the surface of the interlayer insulating film 92. The wiring line 94 is formed by, for example, patterning a metal film formed by sputtering or the like. For example, the scanning signal line 28, the video signal line 30, and the drive power supply line 32, which are shown in FIG. 1, and the wiring line 116 can be formed to have a multilayer wiring structure using the metal film forming the wiring line 94 and the metal film used for forming the gate electrode 86, the source electrode 90a, and the drain electrode 90b. On this configuration, a planarization film 96 formed of a resin material or the like and a passivation film 98 are formed. The OLED 6 is formed on the passivation film 98 in the display region 42. The passivation film 98 is formed of, for example, an inorganic insulating material such as $SiN_y$.

The OLED 6 includes a lower electrode 100, an organic material layer 102, and an upper electrode 104. Specifically, the organic material layer 102 includes a hole transport layer, a light emitting layer, and an electron transport layer. The OLED 6 is typically formed by stacking the lower electrode 100, the organic material layer 102, and the upper electrode 104 in this order from the base material 70 side. In the embodiment, the lower electrode 100 is an anode of the OLED 6, and the upper electrode 104 is a cathode thereof.

When it is assumed that the TFT 72 shown in FIG. 3 is the drive TFT 12 having an n-channel, the lower electrode 100 is connected to the source electrode 90a of the TFT 72. Specifically, after the formation of the planarization film 96 described above, a contact hole 110 for connecting the lower electrode 100 to the TFT 72 is formed, and for example, by patterning a conductor section 111 formed on the surface of the planarization film 96 and in the contact hole 110, the lower electrode 100 connected to the TFT 72 is formed for each pixel. The lower electrode is formed of, for example, a transmitting conductive material such as indium tin oxide (ITO) or indium zinc oxide (IZO), or metal such as Ag or Al.

On the above-described structure, a rib 112 separating the pixels is disposed. For example, after the formation of the lower electrode 100, the rib 112 is formed at the boundary between the pixels, and the organic material layer 102 and the upper electrode 104 are stacked in an effective region (a region where the lower electrode 100 is exposed) of the pixel surrounded by the rib 112. The upper electrode 104 is formed of, for example, an extremely thin alloy of Mg and Ag, or a transmitting conductive material such as ITO or IZO.

The sealing layer 106 is disposed on the upper electrode 104 so as to cover the entire display region 42. The sealing layer 106 has a stacked structure including a first sealing film 161, a sealing planarization film 160, and a second sealing film 162 in this order. The first sealing film 161 and the second sealing film 162 are formed of an inorganic material (e.g., an inorganic insulating material). Specifically, the first sealing film 161 and the second sealing film 162 are formed by depositing a $SiN_y$ film by a chemical vapor deposition (CVD) method. The sealing planarization film 160 is formed using an organic material (e.g., a resin material such as a curable resin composition). On the other hand, the sealing layer 106 is not disposed in a curved region 120 and the component mounting region 46.

Figure 4:
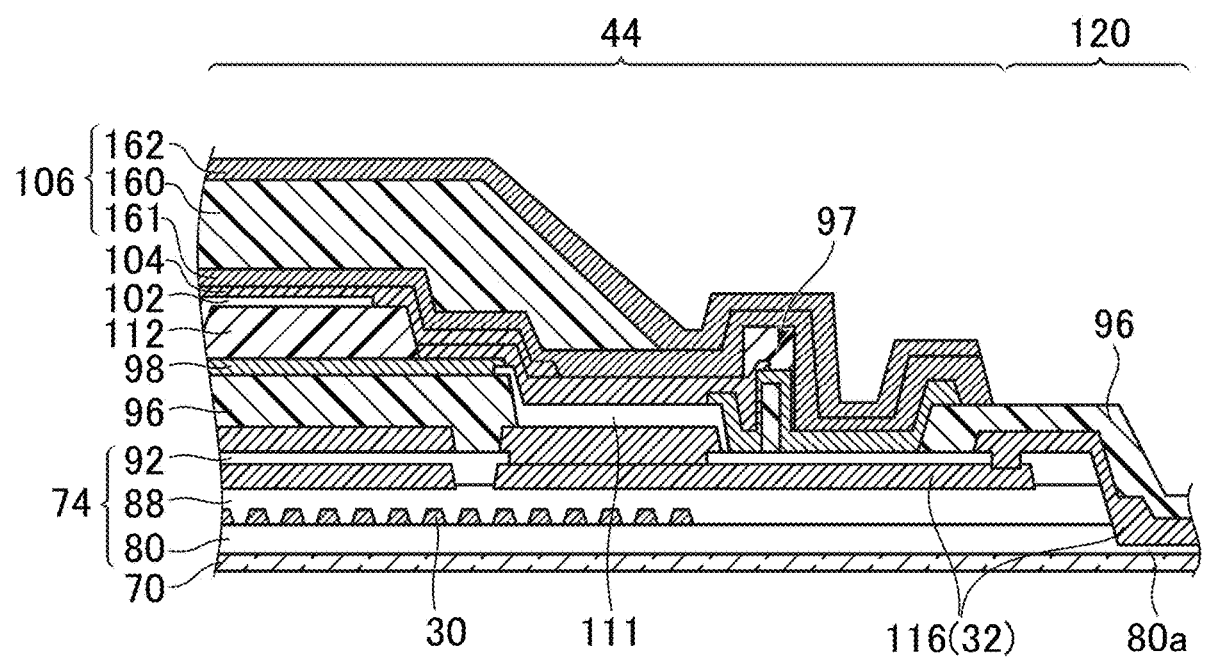
FIG. 4 is a diagram showing one example of a cross section along line A-A of FIG. 2.
Figure 5:
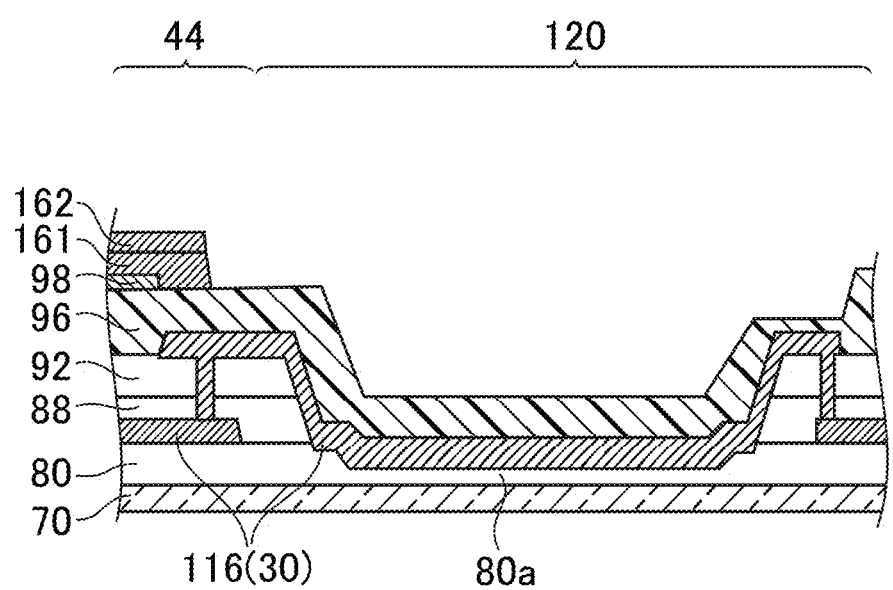
FIG. 5 is a diagram showing one example of a cross section along line B-B of FIG. 2.
Figure 6:
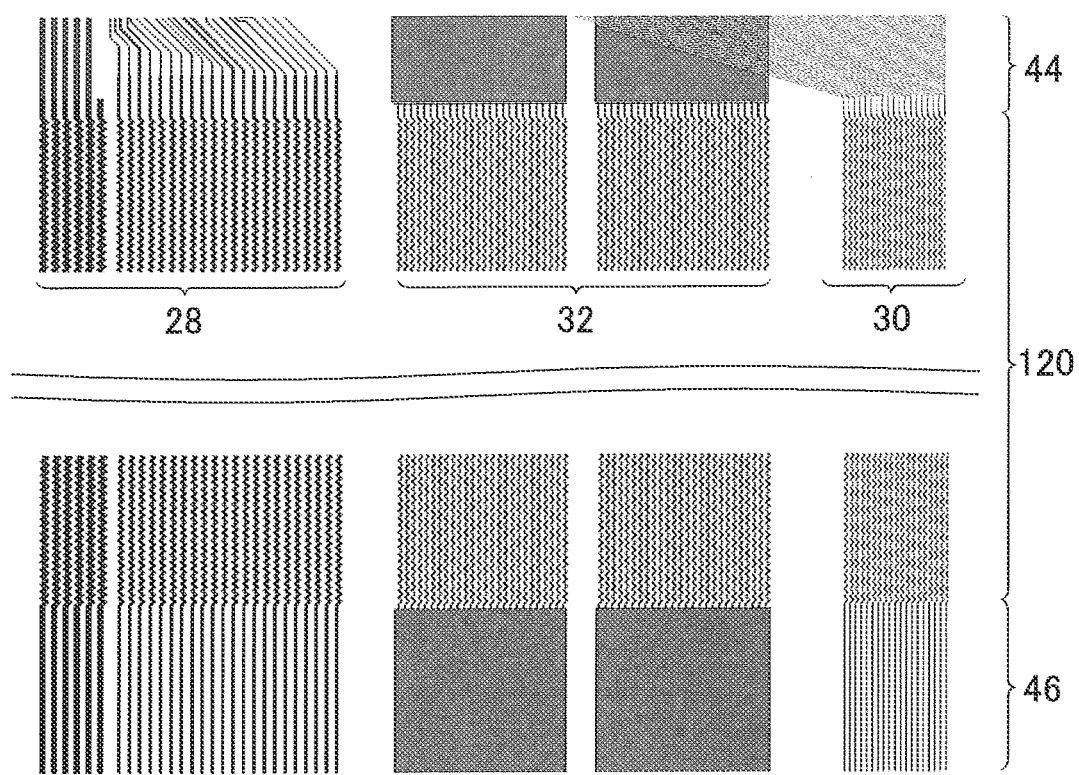
FIG. 6 is a plan view showing one example of an arranged state of wiring lines in a region C surrounded by the broken line of FIG. 2.

FIG. 4 is a diagram showing one example of a cross section along line A-A of FIG. 2. FIG. 5 is a diagram showing one example of a cross section along line B-B of FIG. 2. FIG. 6 is a plan view showing one example of an arranged state of wiring lines in a region C surrounded by the broken line of FIG. 2.

Specifically, FIG. 4 shows a schematic cross-sectional view around a picture-frame region 44. The picture-frame region 44 is a region surrounding the display region 42, and differs from the display region 42 in that, for example, the picture-frame region 44 does not include the TFT 72 and the OLED 6. In the circuit layer 74 of the picture-frame region 44, an electrical wiring line and the like are formed. In addition, the sealing layer 106 is disposed on the circuit layer 74 via the passivation film 98. In the picture-frame region 44, a dam 97 surrounding the display region 42 is formed, and the first sealing film 161 and the second sealing film 162 are formed so as to cover the dam 97. The sealing planarization film 160 is accommodated inside the dam 97 on the display region 42 side).

Specifically, FIG. 5 shows a schematic cross-sectional view along the video signal line 30 around the curved region 120. The display panel 40 may be manufactured with the base material 70 maintained flat as shown in FIG. 3; however, for example, when the display panel 40 is stored in a case of the organic EL display device 2, the curved region 120 is provided outside the display region 42 and the component mounting region 46 is disposed on the rear side of the display region 42.

In the curved region 120, it is preferable to omit or thin the layers (e.g., the under layer 80, the interlayer insulating layer 88, the interlayer insulating film 92, and the passivation film 98) formed of an inorganic insulating material. This is because the layers formed of an inorganic insulating material tend to be broken due to curving. In the illustrated example, the wiring line 116 is disposed on the under layer 80 that is thinned (specifically, a thin region 80a is partially formed by etching or the like) in the curved region 120.

In the curved region 120, the wiring lines 116 (the scanning signal line 28, the video signal line 30, and the drive power supply line 32) have a wavy bending shape as shown in FIG. 6 in order that the wiring lines 116 may correspond to the curving of the display panel 40. Other than the wavy form in the illustrated example, for example, a grid or mesh type and the like are employed for the bending shape.

The drive power supply line 32 is generally linear, and the wiring line width is set to a wide width of several hundred micrometers to several millimeters. However, the wiring line width in the curved region 120 is set to, for example, a narrow width of several micrometers to a dozen or so micrometers. As shown in FIG. 6, with the curved region 120 as a boundary, the width of the drive power supply line 32 is switched from the wide width to the narrow width.

Figure 7A:
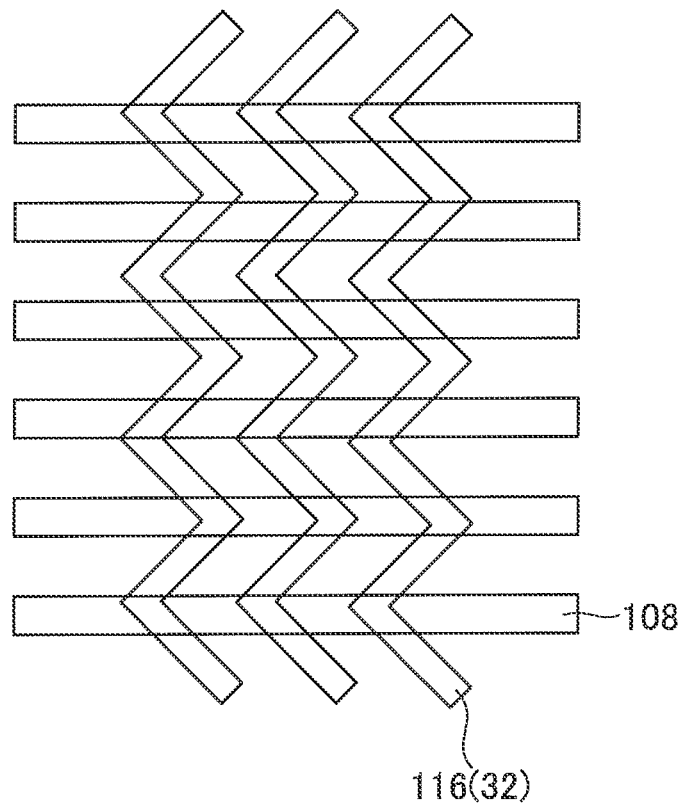
FIG. 7A is a plan view showing one example of the relationship between wiring lines and heat dissipating layers.
Figure 7B:
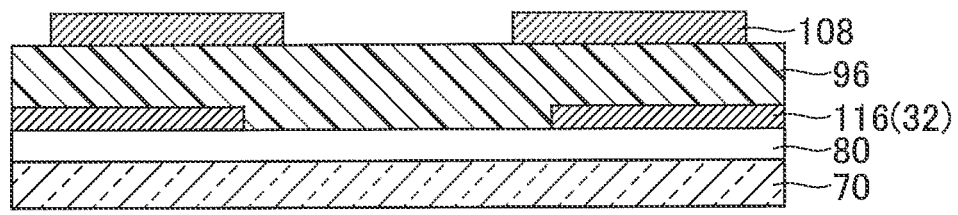
FIG. 7B is a cross sectional view showing one example of the relationship between the wiring lines and the heat dissipating layers.

FIG. 7A is a plan view showing one example of the relationship between wiring lines and heat dissipating layers. FIG. 7B is a cross-sectional view showing one example of the relationship between the wiring lines and the heat dissipating layers. In the curved region 120, a heat dissipating layer 108 is formed on the wiring line 116 (the drive power supply line 32) via the planarization film (resin film) 96. The heat dissipating layer 108 is formed of, for example, a metal material. The heat dissipating layer 108 can be formed when, for example, the electrode of the OLED 6 is formed. Specifically, when the lower electrode (anode) 100 is formed, the heat dissipating layer 108 can be formed of metal (e.g., Ag or Al) constituting the lower electrode.

The heat dissipating layer 108 is formed along a direction crossing a wiring direction of the wiring line 116. In the illustrated example, for example, a plurality of the heat dissipating layers 108 are formed in parallel at a predetermined interval from the viewpoint of suppressing cracking due to curving. In this case, the width of the heat dissipating layer 108 is set to, for example, from several micrometers to several ten micrometers. The length of the heat dissipating layer 108 is set, for example, so as to exceed the width of the drive power supply line 32. Unlike the illustrated example, for example, one heat dissipating layer may be formed to have a wide width, or a heat dissipating layer having a predetermined pattern may be formed. It is preferable that the heat dissipating layer 108 is formed corresponding to at least a part at which the wiring line width is switched from a wide width to a narrow width.

In the curved region 120, for example, the wiring line length is elongated due to the bending of the wiring line 116, which increases a wiring resistance. Moreover, the wiring lines 116 are arranged in parallel on the thinned under layer 80, and therefore, the wiring line may have a narrow width as described above. Therefore, an adverse effect due to heat generation is likely to occur in the curved region 120. Especially at a part at which the wiring line 116 is switched into the bending shape with a narrow width (specifically, at a place several millimeters ahead of the part at which the wiring line width is switched to a narrow width), heat may be locally generated. On the other hand, the under layer 80 and the planarization film 96 have a small heat capacity. As described above, by disposing the heat dissipating layer 108, heat dissipation is promoted, and an adverse effect due to heat generation can be suppressed. Moreover, compared to, for example, a form in which another member such as a heat dissipating sheet is provided, the formation of the heat dissipating layer 108 can contribute to suppression of a manufacturing cost or thinning of the panel.

In the illustrated example, the thickness of the resin film 96 disposed on the wiring line 116 is thinner than the thickness of the planarization film 96 of the display region 42. The thickness of the resin film 96 disposed on the wiring line 116 can be appropriately determined in consideration of, for example, the curved state of the display panel 40, the degree of heat dissipation of heat generation of the wiring line 116, and the like.

Figure 8:
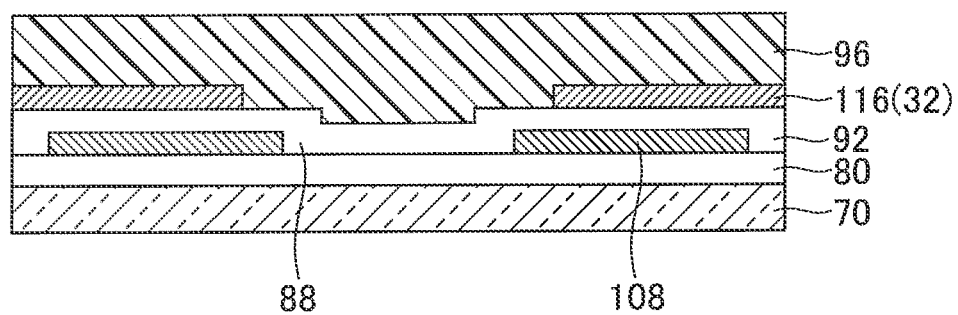
FIG. 8 is a cross-sectional view showing the relationship between wiring lines and heat dissipating layers in another embodiment of the invention.

FIG. 8 is a cross-sectional view of a curved region in another embodiment of the invention. The embodiment differs from the above-described embodiment in that the heat dissipating layer 108 is disposed closer to the base material 70 side than the wiring line 116. Specifically, the heat dissipating layer 108 formed on the under layer 80, the interlayer insulating film 92 is formed so as to cover the heat dissipating layer 108, and the wiring line 116 is disposed on the interlayer insulating film 92. In this case, the heat dissipating layer 108 can be formed when, for example, the gate electrode 86 is formed in the display region 42.

The invention is not limited to the embodiments, but various modifications can be made. For example the configuration shown in the embodiments can be replaced with substantially the same configuration, a configuration providing the same operational effect, or a configuration capable of achieving the same object.

Various altered and modified examples within the range of the idea of the invention will occur to those skilled in the art, and it is understood that the altered and modified examples also belong to the scope of the invention. For example, when those skilled in the art appropriately add or remove a component or change the design of a component in the embodiments described above, or add or omit a step or change the condition of a step in the embodiments described above, such variations are included in the scope of the invention as long as they include the spirit of the invention.

What is claimed is:

1. A TFT substrate comprising:
   a substrate including an active region and a curved region;
   a plurality of TFTs on the active region;
   a wiring line disposed on the substrate and disposed from the active region over the curved region; and
   a heat dissipating layer formed corresponding to a position at which the wiring line is disposed in the curved region, wherein
   the wiring line includes a drive power supply line, and
   the heat dissipating layer is formed corresponding to at least a position at which the drive power supply line is disposed.

2. The TFT substrate according to claim 1, wherein the width of the wiring line in the curved region is formed to be narrower than the width of the wiring line outside the curved region.

3. The TFT substrate according to claim 1, wherein the heat dissipating layer is formed corresponding to a part at which the width of the wiring line is switched from a wider width to a narrower width.

4. The TFT substrate according to claim 1, wherein the wiring line has a bending shape in the curved region in a planar view.

5. The TFT substrate according to claim 1, further comprising:
   a first layer disposed on the substrate and including an inorganic insulating material, wherein
   in the first layer, a thinner region with a thinner thickness is formed in the curved region, and
   the wiring line is disposed on the thinner region.

6. The TFT substrate according to claim 1, wherein the heat dissipating layer is formed along a direction crossing a wiring direction of the wiring line.

7. The TFT substrate according to claim 1, wherein a plurality of the heat dissipating layers are formed in parallel at an interval.

8. A TFT substrate comprising:
   a substrate including an active region and a curved region;
   a wiring line disposed on the substrate and disposed from the active region over the curved region;
   a heat dissipating layer formed corresponding to a position at which the wiring line is disposed in the curved region; and
   a first layer disposed on the substrate and including an inorganic insulating material, wherein
   in the first layer, a thinner region with a thinner thickness is formed in the curved region, and
   the wiring line is disposed on the thinner region.

9. The TFT substrate according to claim 8, wherein the wiring line includes a drive power supply line, and the heat dissipating layer is formed corresponding to at least a position at which the drive power supply line is disposed.

10. The TFT substrate according to claim 8, wherein the width of the wiring line in the curved region is formed to be narrower than the width of the wiring line outside the curved region.

11. The TFT substrate according to claim 8, wherein the heat dissipating layer is formed corresponding to a part at which the width of the wiring line is switched from a wider width to a narrower width.

12. The TFT substrate according to claim 8, wherein the wiring line has a bending shape in the curved region in a planar view.

13. The TFT substrate according to claim 8, wherein the heat dissipating layer is formed along a direction crossing a wiring direction of the wiring line.

14. The TFT substrate according to claim 8, wherein a plurality of the heat dissipating layers are formed in parallel at an interval.

15. A TFT substrate comprising:
    a substrate including an active region and a curved region;
    a wiring line disposed on the substrate and disposed from the active region over the curved region; and
    a heat dissipating layer formed corresponding to a position at which the wiring line is disposed in the curved region, wherein
    the width of the wiring line in the curved region is formed to be narrower than the width of the wiring line outside the curved region.

16. The TFT substrate according to claim 15, wherein the heat dissipating layer is formed corresponding to a part at which the width of the wiring line is switched from a wider width to a narrower width.

17. The TFT substrate according to claim 15, wherein the wiring line has a bending shape in the curved region in a planar view.

18. The TFT substrate according to claim 15, wherein the heat dissipating layer is formed along a direction crossing a wiring direction of the wiring line.

19. The TFT substrate according to claim 15, wherein a plurality of the heat dissipating layers are formed in parallel at an interval.

* * * * *